United States Patent
Fan et al.

(10) Patent No.: US 8,818,768 B1
(45) Date of Patent: *Aug. 26, 2014

(54) MODELING THREE-DIMENSIONAL INTERIORS FROM PHOTOGRAPHIC IMAGES, AND APPLICATIONS THEREOF

(75) Inventors: Zhe Fan, Boulder, CO (US); Brian Gammon Brown, Boulder, CO (US); Tilman Reinhardt, Woodside, CA (US); Matthew Robert Simpson, San Francisco, CA (US)

(73) Assignee: Google Inc., Mountain View, CA (US)

( * ) Notice: Subject to any disclaimer, the term of this patent is extended or adjusted under 35 U.S.C. 154(b) by 55 days.

This patent is subject to a terminal disclaimer.

(21) Appl. No.: 12/903,036

(22) Filed: Oct. 12, 2010

(51) Int. Cl.
*G06F 17/50* (2006.01)
*G06T 15/00* (2011.01)

(52) U.S. Cl.
USPC ............................................. 703/1; 345/419

(58) Field of Classification Search
CPC ................. G06F 17/5004; G06T 2207/10032; G06T 2207/20101; G06T 2207/30184; G06T 2200/24; G06T 7/0065; G06T 2200/08; G06T 2207/30244; G06T 7/0046; G06T 7/0075
USPC ............................................. 703/1; 345/419
See application file for complete search history.

(56) References Cited

U.S. PATENT DOCUMENTS

| | | | |
|---|---|---|---|
| 6,628,279 B1 * | 9/2003 | Schell et al. ................... | 345/420 |
| 6,867,771 B2 * | 3/2005 | Kripac .......................... | 345/420 |
| 6,912,293 B1 | 6/2005 | Korobkin | |
| 7,277,572 B2 * | 10/2007 | MacInnes et al. ............. | 382/154 |
| 7,693,325 B2 * | 4/2010 | Pulla et al. .................... | 382/154 |
| 7,873,917 B2 * | 1/2011 | Larsen et al. ................. | 715/833 |
| 8,115,761 B1 * | 2/2012 | Fan et al. ...................... | 345/419 |
| 8,115,762 B1 * | 2/2012 | Fan et al. ...................... | 345/419 |
| 8,392,150 B2 * | 3/2013 | Mujtaba et al. ................... | 703/1 |
| 2009/0141966 A1 * | 6/2009 | Chen et al. .................... | 382/154 |
| 2009/0256909 A1 | 10/2009 | Nixon | |
| 2010/0134486 A1 * | 6/2010 | Colleen ......................... | 345/419 |
| 2010/0214291 A1 * | 8/2010 | Muller et al. ................. | 345/420 |

OTHER PUBLICATIONS

Autodesk® ImageModeler™ 2009 User Guide, Autodesk, Inc.*
Benner et al., "Flexible Generation of Semantic 3D Building Models," The International Archives of the Photogrammetry, Remote Sensing and Spatial Information Sciences, vol. 34, Part XXX, 2005, 6 pages.
"Photogrammetry," Wikipedia, the free encyclopedia, http://en.wikipedia.org/w/index.php?title=Photogrammetry&oldid=389320451, Oct. 7, 2010, 4 pages.

* cited by examiner

*Primary Examiner* — Aniss Chad
(74) *Attorney, Agent, or Firm* — Dority & Manning, P.A.

(57) ABSTRACT

Embodiments relate to modeling three-dimensional interiors from photographic images. In a first embodiment, a computer-implemented method creates a three-dimensional model of an interior of a building from a photographic image. Input data is received from a user specifying a floor plan of the interior of the building. A first constraint input by a user indicating that a position on the floor plan corresponds to a position on the three-dimensional model is received. A second constraint input by a user indicating that a position on a photographic image of the interior corresponds to a position on the three-dimensional model is received. Finally, the three-dimensional model and camera parameters representing a camera that took the photographic image of the interior are altered based on the first and second constraints.

26 Claims, 13 Drawing Sheets

MODELING THREE-DIMENSIONAL INTERIORS FROM PHOTOGRAPHIC IMAGES, AND APPLICATIONS THEREOF

BACKGROUND

1. Field of the Invention

This field is generally related to three-dimensional modeling.

2. Related Art

Three-dimensional modeling tools, such as a SKETCHUP tool available from Google Inc., and other computer-aided design (CAD) tools enable users to define three-dimensional models, such as a three-dimensional model of a building. Photographic images of the building may be available from, for example, satellite, aerial, vehicle-mounted street-view and user cameras. The photographic images of the building may be texture mapped to the three-dimensional model to create a more realistic rendering of the building.

BRIEF SUMMARY

Embodiments relate to modeling three-dimensional interiors from photographic images. In a first embodiment, a computer-implemented method creates a three-dimensional model of an interior of a building from a photographic image. Input data is received from a user specifying a floor plan of the interior of the building. A first constraint input by a user indicating that a position on the floor plan corresponds to a position on the three-dimensional model is received. A second constraint input by a user indicating that a position on a photographic image of the interior corresponds to a position on the three-dimensional model is received. Finally, the three-dimensional model and camera parameters representing a camera that took the photographic image of the interior are altered based on the first and second constraints.

In a second embodiment, a system creates a three-dimensional model of an interior of a building from a photographic image. The system includes an interior floor plan module that receives input data from a user specifying a floor plan of the interior of the building. A user constraint input module receives a first constraint input by a user indicating that a position on the floor plan corresponds to a position on the three-dimensional model and receives a second constraint input by a user indicating that a position on a photographic image of the interior corresponds to a position on the three-dimensional model. A photogrammetry module alters, based on the first and second constraints, the three-dimensional model and camera parameters representing a camera that took the photographic image of the interior.

In a third embodiment, a computer program product includes a tangible computer useable medium having control logic stored therein for causing a computer to create a three-dimensional model of an interior of a building from a photographic image. The computer control logic includes computer readable program code for: (a) receiving input data from a user specifying a floor plan of the interior of the building; (b) receiving a first constraint input by a user indicating that a position on the floor plan corresponds to a position on the three-dimensional model; (c) receiving a second constraint input by a user indicating that a position on a photographic image of the interior corresponds to a position on the three-dimensional model; and (d) for altering, based on the first and second constraints, the three-dimensional model and camera parameters representing a camera that took the photographic image of the interior.

Further embodiments, features, and advantages of the invention, as well as the structure and operation of the various embodiments of the invention are described in detail below with reference to accompanying drawings.

BRIEF DESCRIPTION OF THE FIGURES

The accompanying drawings, which are incorporated herein and form a part of the specification, illustrate the present invention and, together with the description, further serve to explain the principles of the invention and to enable a person skilled in the pertinent art to make and use the invention.

The drawing in which an element first appears is typically indicated by the leftmost digit or digits in the corresponding reference number. In the drawings, like reference numbers may indicate identical or functionally similar elements.

DETAILED DESCRIPTION OF EMBODIMENTS

Embodiments relate to creating three-dimensional models from two-dimensional images. In a first embodiment, a photogrammetry algorithm is used to derive the three-dimensional model from selections on the two-dimensional images. Even though certain parameters to the photogrammetry algorithm may be inaccurate, the inaccurate parameters may be locked. In this way, the computing resources needed to derive the three-dimensional model may be reduced. In a second embodiment, photographic images may be texture mapped to a three-dimensional model. In the second embodiment, an orientation of unconstrained photographic image may be compared to an orientation of a face of the three-dimensional model. Based on the comparison, the second embodiment may notify a user that constraining the image may allow the face of the three-dimensional model to be texture mapped. In a third embodiment, a three-dimensional model of a building interior may be created from two-dimensional images of the interior. In the third embodiment, a floor plan may be used to derive the three-dimensional model. These and other embodiments are described below with reference to the accompanying drawings.

In the detailed description of embodiments that follows, references to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Photogrammetry

Figure 1:
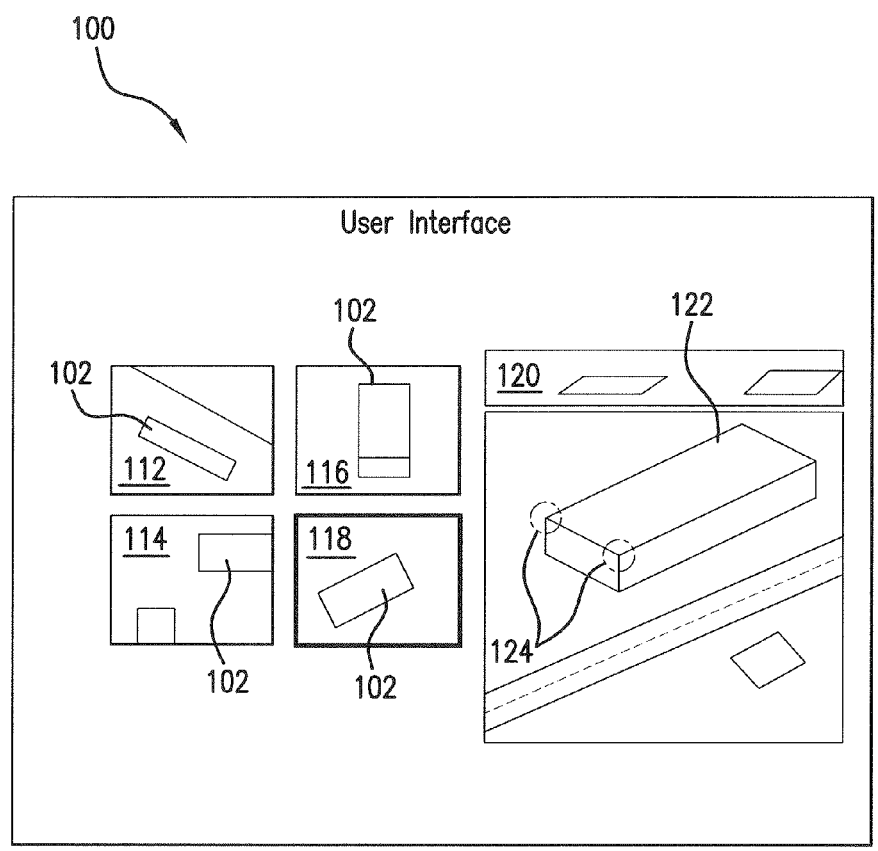
FIG. 1 is a diagram showing a user interface for creating a three-dimensional model from two-dimensional images.

FIG. 1 shows a diagram showing a user interface 100 for creating a three-dimensional model from two-dimensional images. As described below with respect to FIG. 12, user interface 100 may, in an embodiment, be a web based user interface. In the embodiment, a server may serve to a client data, such as Hypertext markup language (HTML) data, Javascript, or animation (e.g. FLASH) data, specifying user interface 100. Using that data, the client may render and display user interface 100 to a user.

User interface 100 includes images 112, 114, 116, and 118 of a building 102. Each of images 112, 114, 116, and 118 is a photographic image capturing building 102 from a different perspective. Each of images 112, 114, 116, and 118 may be an aerial or satellite image and may have oblique and nadir images. Further, one or more of images 112, 114, 116, and 118 may be a photographic image captured from street level, such as a portion of a panoramic image captured from a vehicle in motion. Each of images 112, 114, 116, and 118 may be displayed with an indication (such as a colored outline) indicating whether a user constraint has been received for the image.

Figure 2:
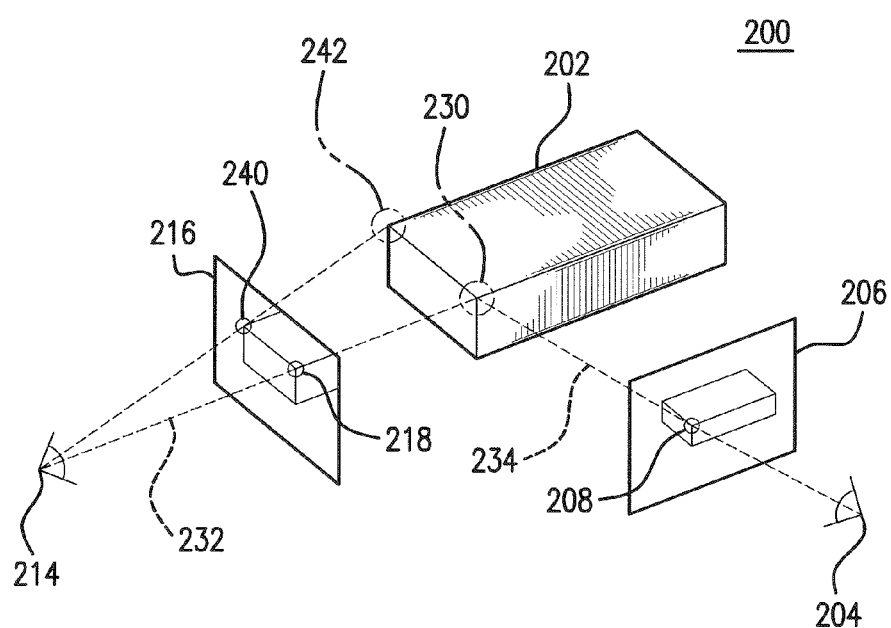
FIG. 2 is a diagram illustrating creating a three-dimensional model from user selections in two-dimensional images.

In an example, a user may select one of images 112, 114, 116, and 118 to display in a viewport 120. In viewport 120, a three-dimensional model 122 may be displayed. Three-dimensional model 122 may be displayed, for example, as a wireframe structure so as to avoid obscuring the photographic image in viewport 120. By selecting points, such as points 124, on three-dimensional model 122, a user may constrain three-dimensional model 122 to the image in viewport 120. More specifically, a user may indicate that a position on the three-dimensional model corresponds to a position on the photographic image in viewport 120. By inputting constraints for the plurality of images 112, 114, 116, and 118, a user can specify where three-dimensional model 122 appears in each of the images. Based on the user specifications, the geometry of three-dimensional model 122 may be determined using a photogrammetry algorithm as illustrated in FIG. 2. In this way, a user may define three-dimensional model 122 to model building 102 using images of the building.

FIG. 2 shows a diagram 200 illustrating creating a three-dimensional model from user selections in two-dimensional images. Diagram 200 shows a three-dimensional model 202 and multiple photographic images 216 and 206 of a building. Images 216 and 206 were captured from cameras having different perspectives, as illustrated by camera 214 and 204. As mentioned above, a user may input constraints on images 216 and 206, such as constraints 218 and 208, and those constraints may be used to determine the geometry of three-dimensional model 200. The geometry of three-dimensional model 202 may be specified by a set of geometric parameters, representing, for example, a position of an origin point (e.g., x, y, and z coordinates), a scale (e.g., height and width), an orientation (e.g., pan, tilt, and roll). Depending on a shape of three-dimensional model 202 (e.g., box, gable, hip, pyramid, top-flat pyramid, or ramp) additional geometric parameters may be needed. For example, to specify the geometry of a gable, the angle of the gable's slopes or a position of the gable's tip may be included in the geometric parameters.

To determine the geometry of three-dimensional model 202, the user constraints from the images may be used to determine rays in three-dimensional space and the rays are used to determine the geometry. In diagram 200, a ray 232 may be determined based on user constraint 218, and a ray 234 may be determined based on a user constraint 208. Rays 232 and 234 are constructed based on parameters associated with cameras 214 and 204 respectively. For example, ray 232 may be extended from a focal point or entrance pupil of camera 214 through a point corresponding to user constraint 218 at a focal length distance from the focal point of camera 214. Similarly, ray 234 may be extended from a focal point or entrance pupil of camera 204 through a point corresponding to user constraint 208 at a focal length distance from the focal point of camera 204. Using rays 232 and 234, a position 230 on three-dimensional model 202 may be determined. This process is known as photogrammetry. In this way, the geometry of three-dimensional model 202 may be determined based on user constraints 218 and 208, and parameters representing cameras 214 and 204.

However, the parameters representing cameras 214 and 204 may not be accurate. In an embodiment, the camera parameters may include a position, orientation (e.g., pan, tilt, and roll), angle, focal length, prism point, and a distortion factor of each of cameras 214 and 204. In an example, photographic images 216 and 206 may have been taken from satellites, vehicles, or airplanes, and the camera position and orientation may not be completely accurate. Alternatively, one or both of photographic images 216 and 206 may have been taken by a user with only a general idea of where her camera was positioned when it took the photo.

In cases where the camera parameters are inaccurate, a photogrammetry algorithm may need to solve both the camera parameters representing the cameras that took the photographic images and geometric parameters representing the three-dimensional model. This may represent a large and complex linear programming problem.

Locking Photogrammetry Parameters

Solving the large and complex linear programming problem needed to determine a three-dimensional model from two-dimensional photographic images may be computationally intensive. The computing power needed to solve the linear programming problem may slow the response time to update the three-dimensional model based on a user input. The additional computing power may be particularly problematic when the linear programming is conducted within a web browser or browser plug-in. To deal with this problem, embodiments lock parameters, despite being inaccurate, to simplify the linear programming problem and reduce the processing requirements. These embodiments are illustrated, for example, in FIGS. 3-5.

Figure 3:
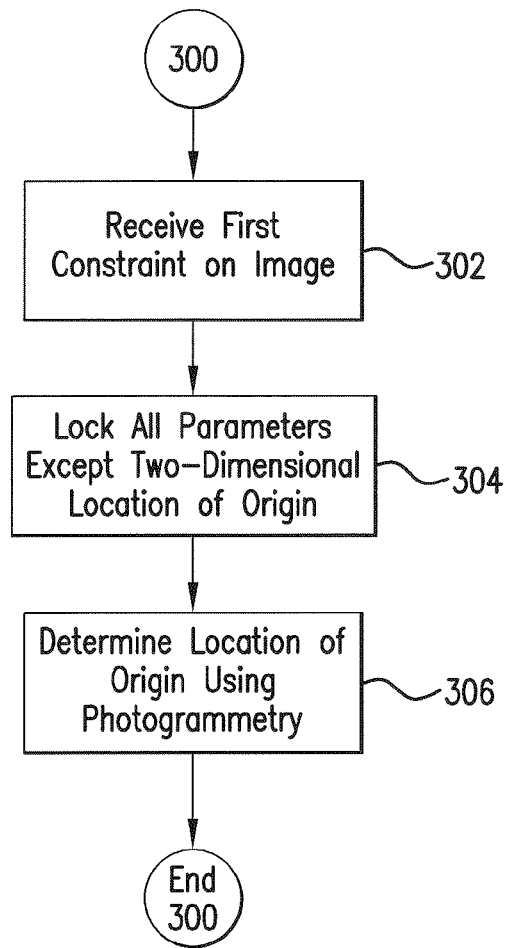
FIG. 3 is a flowchart showing a method for modifying a three-dimensional model based on a first received user constraint.

FIG. 3 is a flowchart showing a method 300 for modifying a three-dimensional model based on a first received user constraint. Prior to the start of method 300, the user may select a shape of the three-dimensional model. For example, a user may select one of several common shapes found in buildings, such as a box, gable, hip, pyramid, top-flat pyramid, or ramp. In other examples, a user may be able to define a custom shape.

When initially added, the three-dimensional model may be positioned at a default point a three-dimensional environment. In an example, the origin of the model may be set to known vertical coordinate, such as a known elevation of the ground in the three-dimensional environment, or a height of a three-dimensional model previously added to the three-dimensional model. The horizontal coordinates of the origin may be set to place the shape in the center of a photographic image in a viewport, such as a viewport 120 in FIG. 1. Other geometric parameters, such as scale and orientation, may also be set to default values.

With the new three-dimensional model added to the three-dimensional environment, a user may seek to modify it by inputting a constraint mapping a position on the three-dimensional model with a position in a two-dimensional image. For example, a user may select a corner of the model and drag it to a new position in the two-dimensional image. In method 300, a first user constraint for the three-dimensional model is received at step 302.

At step 304, all parameters—both the camera parameters and the geometric parameters are locked, except for the horizontal location of the shape. In an embodiment, the only parameters that may remain unlocked are x and y coordinates of the shape. Then, at step 306, the horizontal location of the shape is solved using photogrammetry. In this way, when a user inputs the first constraint, the shape may be translated to a new position, but its other geometric parameters, such as scale and orientation, may not change.

An example operation of method 300 is described with respect to FIG. 2. In the example, three-dimensional model 202 is initially added. Once three-dimensional model 202 is added, a user may add a first constraint 240. Constraint 240 maps a position on photographic image 216 to a position 242 on three-dimensional model 202. When the user adds constraint 240, three-dimensional model 202 is translated such that position 242 would appear as a location on photographic image 216 defined by constraint 240. Similarly, if a user moved constraint 240 on photographic image 216, three-dimensional model 202 would be translated such that position 242 follows constraint 240.

By locking all parameters except a horizontal location of origin, method 300 enables the user to position the shape without having to consider initially other aspects of the shape's geometry. To define other aspects of the shape's geometry, a user may input additional constraints as illustrated in FIG. 4.

In an embodiment, a three-dimensional model may include a plurality of separate three-dimensional shapes (e.g., box, gable, hip, pyramid, top-flat pyramid, or ramp). Each shape may have its own set of geometric parameters. In that embodiment, method 300 may be executed when a first constraint is received mapping a position on a shape to a position on an image. In other words, method 300 may be executed once for each shape.

Figure 4A:
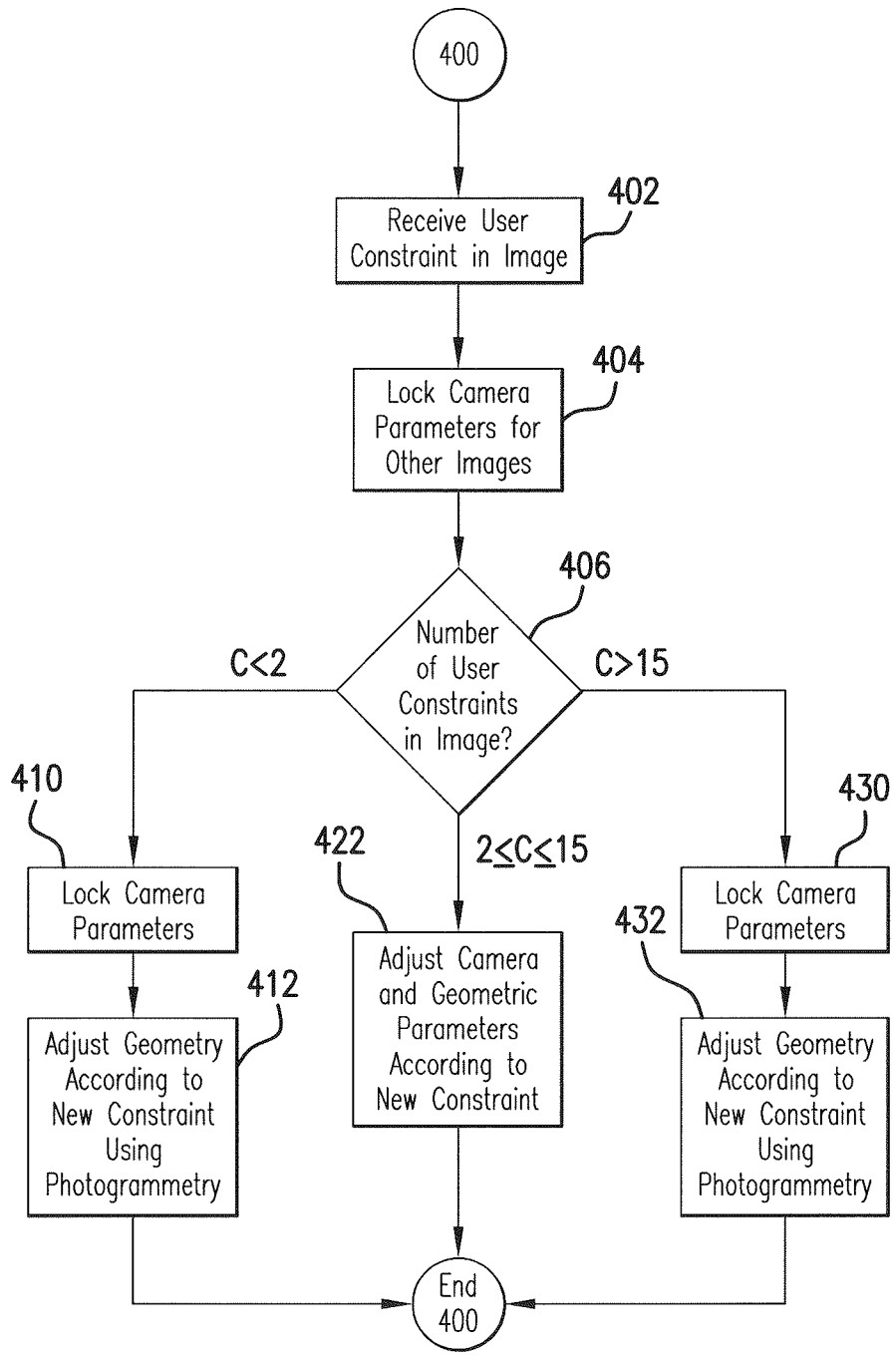
FIG. 4A is a flowchart showing a method for modifying a three-dimensional model based on a number of user constraints received for an image.

FIG. 4A is a flowchart showing a method 400 for modifying a three-dimensional model based on a number of user constraints received for an image. While method 300 may lock parameters based on a number of constraints received for a shape, method 400 may lock parameters based on a number of constraints received for an image, regardless of the number of shapes constrained to the image.

Method 400 may be used when a constraint is received for a image that corresponds to relatively accurate camera parameters. For example, aerial and satellite images have relatively accurate camera parameters as compared to street view and user images. In that example, method 400 may be used for aerial and satellite images, but not for street view and user images.

Method 400 begins at step 402 with receipt of a user constraint on an image. The constraint received in step 402 may be subsequent to the first constraint received in method 300 in FIG. 3.

Method 400 presents a number of different cases depending on how many user constraints have been received for the image. Depending on the number of constraints that have been received, different parameters may be locked. However, regardless of the number of constraints received, camera parameters are locked for every camera, except the camera that took the image constrained, at step 404.

An example operation of steps 402 and 404 is described with respect to FIG. 2. At FIG. 2, after first user constraint 240 is inputted to position three-dimensional model 202, a user inputs a second constraint 218 on image 216 taken by camera 214. Constraint 218 is received at step 402. At step 404, camera parameters, other than parameters for camera 214 that took image 216 are locked. Thus, in FIG. 2, parameters for camera 204 are locked at step 404.

While parameters for other cameras may be locked regardless of the number of user constraints, whether other parameters are locked may depend on the number of user constraints received, as illustrated at decision block 406. In an embodiment, decision block 406 may provide different operation depending on the total number of constraints received for the image constrained in step 402.

Depending on the number of constraints, decision block 406 may present different operation. If the number of constraints is less than a first threshold value (e.g., <2), camera parameters for the image constrained in step 402 may be locked at step 410. With all the camera parameters locked, linear programming may be used to solve geometric parameters associated with the three-dimensional model at step 412.

Referring to FIG. 2 for an example operation of steps 410 and 412. When a user inputs constraint 218 (after previously entering constraint 240), parameters for camera 214 are locked. Linear programming is used to determine the geometric parameters for three-dimensional model 202. In an embodiment, linear programming is used to determine each of the geometric parameters. In this way, the user may adjust a geometry of three-dimensional model 202.

By locking the camera parameters of the image constrained in step 410, method 400 may leverage the fact that the camera parameters, while being inaccurate, are likely more accurate than the geometry of the three-dimensional model. This better accuracy may be due to the fact that the camera location is tracked electronically, whereas the geometry of the three-dimensional model is input by a user. While locking camera parameters known to be inaccurate may reduce the accuracy of the photogrammetry algorithm, it may also reduce computing requirements and reduce speed.

In a further embodiment, linear programming is used to determine each of the geometric parameters, except a vertical coordinate of the origin, which may be locked with the camera parameters. In this way, the vertical location three-dimensional model 202 may remain fixed, for example, to an elevation of the ground or the elevation of a previously defined three-dimensional model. In this way, a user may stack multiple three-dimensional models to represent, for example, a building.

As the user enters more constraints, the geometry of the three-dimensional model becomes increasingly accurate. After the number of user constraints is greater than or equal to the first threshold (e.g. ≥2), decision block 406 switches from locking the camera and solving the geometry to solving both the camera and the geometry. This operation is illustrated at step 422.

At step 422, neither geometric nor camera parameters may be locked. Linear programming may be used to solve both camera parameters associated with the camera constrained and geometric parameters associated with the three-dimensional model. For example, linear programming may be used to modify a position, orientation, focal length, prism point, and a distortion factor of the camera that took the image constrained in step 402 and parameters specifying the three-dimensional model.

As the user continues to input more constraints, the accuracy of camera parameters may be improved. However, at some point the improvement in accuracy by adjusting the camera parameters may hit a point of diminishing returns. At that point, decision block 406 may switch operation from solving both the camera and the geometry back to solving the geometry and locking the camera. This operation is illustrated at steps 430 and 432.

At step 430, when the number of constraints exceeds a second threshold (e.g., >15), the camera parameters may be locked. With the camera parameters locked, linear programming may be used to solve geometric parameters associated with the three dimensional model. In this way, as the user continues to enter constraints, the geometry of the three-dimensional model may continue to adjust based on those constraints.

Switching between locking and unlocking camera parameters and (as is discussed below) geometric parameters may not be readily apparent to a user. For example, referring to FIG. 1, when a camera parameter is altered, how the photographic image is rendered into viewport 120 may not change. However, how three-dimensional model 122 is displayed in viewport 120 may change, because, for example, the camera may move relative to three-dimensional model 122. Because locking parameters as illustrated in method 400 may not be readily apparent to a user, the interface provided by method 400 may be intuitive to the user.

In addition to providing an intuitive interface, method 400 may improve processing speed. As mentioned above, using linear programming to solve many different parameters may be computationally intensive. By locking some parameters (e.g., keeping them constant), the computational requirements may be reduced. While the computational requirements may be reduced, the resulting parameters may not be as accurate.

To reduce potential inaccuracies from the linear programming algorithm, method 400 may use heuristics to lock parameters based on their relative accuracy. For example, because the camera parameters may initially be more accurate than geometric parameters, the camera parameters are initially locked. The camera parameters may be relatively accurate when the photographic images are taken from a camera that automatically and reliably tracks its position and orientation (and perhaps other parameters). Such cameras may include satellite, aerial, and vehicle-mounted street-level cameras.

In contrast to satellite and aerial images, camera parameters for vehicle-mounted street-level cameras and for photographic images taken and uploaded by a user may be relatively less accurate. In an example, a user may only have a rough idea where the photograph was taken and little or no data may be available for other camera parameters. An embodiment for handling user-inputted photographic images is described below with respect to FIG. 4B.

Figure 4B:
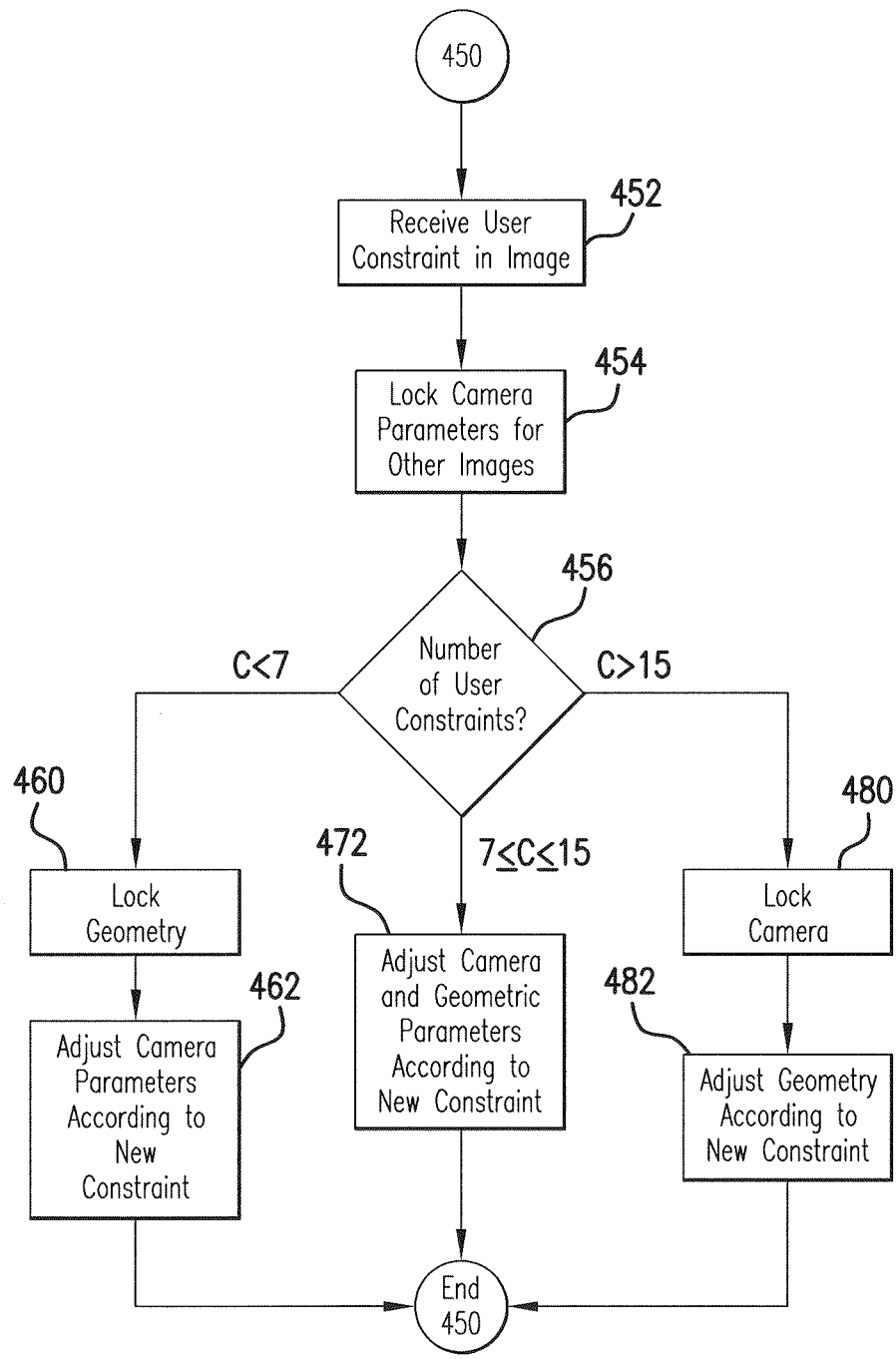
FIG. 4B is a flowchart showing another method for modifying a three-dimensional model based on a number of user constraints received for an image.

FIG. 4B is a flowchart showing a method 450 for modifying a three-dimensional model based on a number of user constraints received for an image. Method 450 may be used when a constraint is received for a image that corresponds to relatively inaccurate camera parameters. For example, method 450 may be used for street view and user images, but not for aerial and satellite images.

As with method 400, method 450 begins at step 452 with receipt of a user constraint on an image. At step 454, camera parameters, other than parameters for camera that took the image for which the constraint is received, are locked.

Depending on the number of constraints, decision block 456 may present different operation. If the number of constraints is less than a first threshold value (e.g., <7), geometric parameters for the three-dimensional model may be locked at step 460. With the geometric parameters locked, linear programming may be used to solve camera parameters associated with the image constrained in step 402.

As the user enters more constraints, the camera becomes increasingly accurate. After the number of user constraints is greater than or equal to the first threshold (e.g. ≥7), decision block 456 switches from locking the geometry and solving the camera to solving both the camera and the geometry. This operation is illustrated at step 472.

At step 472, neither geometric nor camera parameters may be locked. Linear programming may be used to solve both camera parameters associated with the camera constrained and geometric parameters associated with the three-dimensional model. For example, linear programming may be used to modify a position, orientation, focal length, prism point, and a distortion factor of the camera that took the image constrained in step 452 and parameters specifying the three-dimensional model.

As the user continues to input more constraints, the accuracy of camera parameters may be improved. However, at some point, the improvement in accuracy by adjusting the camera parameters may hit a point of diminishing returns. At that point, decision block 406 may switch operation from solving both the camera and the geometry to locking the camera and solving the geometry. This operation is illustrated at steps 480 and 482.

At step 480, when the number of constraints exceeds a second threshold (e.g., >15), the camera parameters may be locked. With the camera parameters locked, linear programming may be used to solve geometric parameters associated with the three dimensional model. In this way, as the user continues to enter constraints, the geometry of the three-dimensional model may continue to adjust based on those constraints.

By locking the geometric parameters of the three dimensional model constrained in step 460, method 450 may leverage the fact that the geometric parameters, while being inaccurate, are likely more accurate than the camera that took the image constrained at step 450. This better accuracy may be due to the fact that the geometry of the three-dimensional model has already been defined, at least in part, by a user. In an embodiment, a user may only be able to use a street view or user image after the user has already at least partly defined the three-dimensional model. This embodiment is illustrated in FIG. 5.

Figure 5:
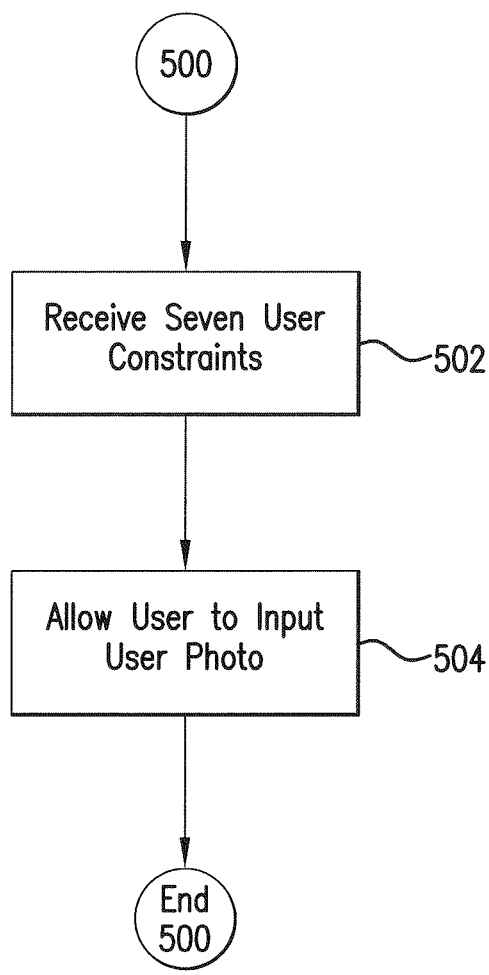
FIG. 5 is a flowchart showing a method for modifying a three-dimensional model based on a user constraint that maps a location on the three-dimensional model with a location on a photo input by a user.

FIG. 5 is a flowchart showing a method 500 for modifying a three-dimensional model based on a user constraint that maps a location on the three-dimensional model to a location on a street view image or a photographic image input by a user.

Method 500 begins at step 502 with receiving a threshold number of user constraints (e.g., seven). Only after that threshold has been satisfied is the user allowed to input a photographic image at step 504. In an example, different thresholds may be used for street view images versus a photographic image input by a user due to their relative levels of accuracy.

In this way, method 500 enables a user to input a photographic image that she may have taken with her own camera. Because camera parameters for user-inputted images are less accurate than for automatically generated images, user-inputted photographic images may be less useful for determining a geometry of a three-dimensional model than automatically generated images. However, user-inputted photographic images may be more current or may have higher resolution than other images. Further, a user may input a photographic images to capture a portion of a building that may be obscured from view for other cameras. For example, a tree may obstruct the view of a building from a road and, for that reason, street-level imagery captured from a vehicle mounted camera may not be available. In that example, a user may take an unobstructed photograph of the building from another side of the tree.

More current, higher resolution, and less obstructed imagery may be useful to texture map onto a three-dimensional model to create a more realistic depiction of, for example, a building. Texture mapping images to the three-dimensional model is discussed below with respect to FIGS. 6-8.

Texture Mapping Images to a Three-Dimensional Model

Figure 6:
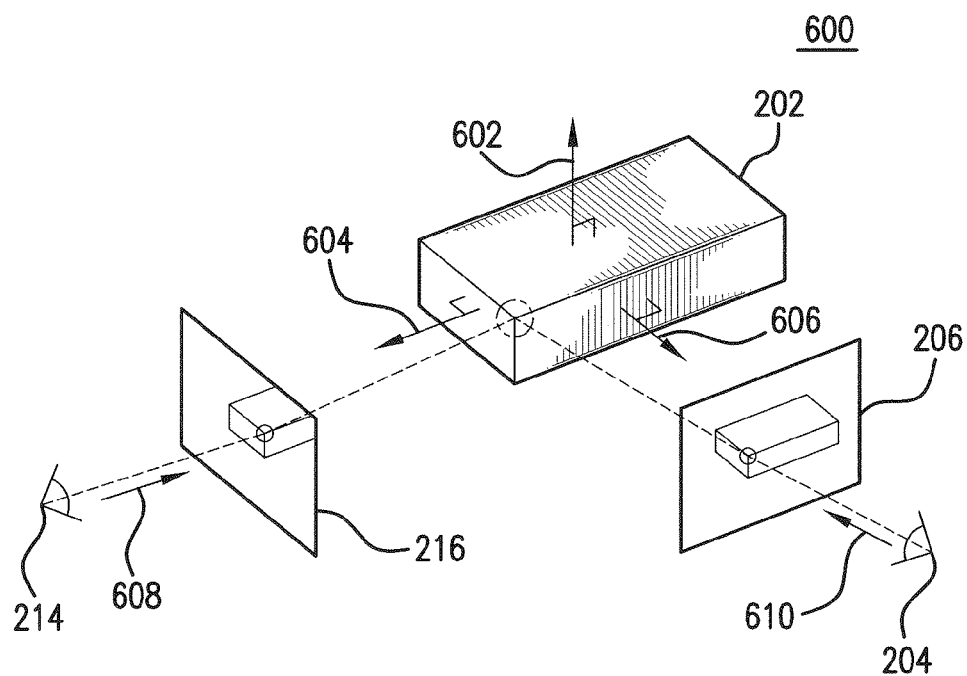
FIG. 6 is a diagram illustrating texture mapping photographic images to a three-dimensional model.

FIG. 6 shows a diagram 600 illustrating texture mapping photographic images to a three-dimensional model. Similar to diagram 200 in FIG. 2, diagram 600 includes photographic images 216 and 206, which were taken by cameras 214 and 204. Diagram 600 also includes three-dimensional model 202.

In diagram 600, each polygon face of three-dimensional model 202 has a normal vector such as vectors 602, 604, and 606. Cameras 214 and 204 have respective vectors 608 and 610 that indicate their orientation. To determine which of images 216 and 206 to texture each polygon of the three-dimensional model 202, vectors 602, 604, and 606 may each be compared with vectors 608 and 610. In this way, images may be selected to texture map each side of three-dimensional model 202.

Determining which images to texture map to each polygon and whether any images may be used to texture map to a polygon of a three-dimensional model is described in greater detail below with respect to FIG. 7.

Figure 7:
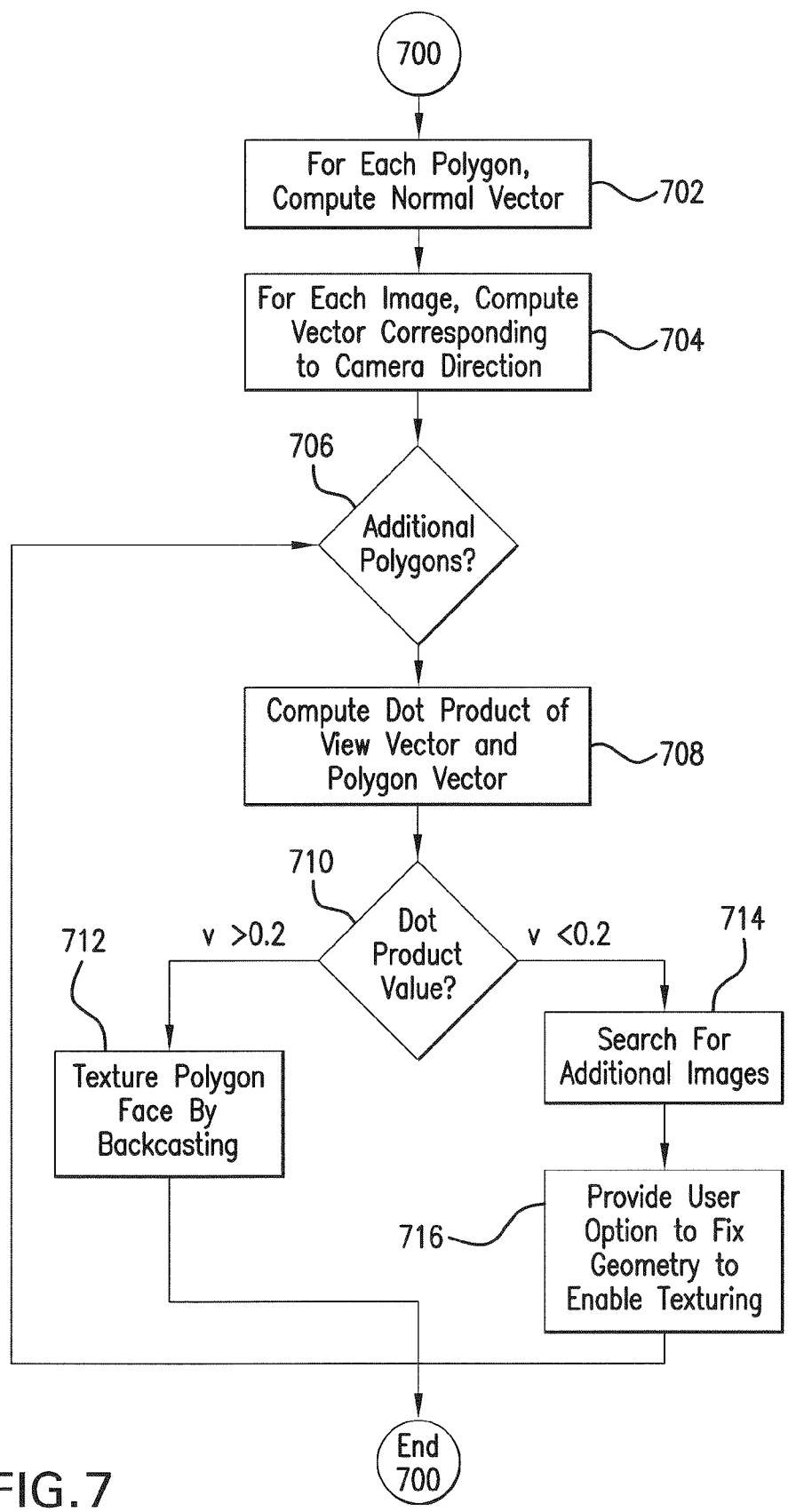
FIG. 7 is a flowchart showing a method for texture mapping photographic images to a three-dimensional model.

FIG. 7 is a flowchart showing a method 700 for texture mapping photographic images to a three-dimensional model.

Method 700 begins by computing a normal vector for each polygon of the three-dimensional model at step 702. Each normal vector may be perpendicular to a two-dimensional face of the three-dimensional model. In other words, each normal vector may be at a 90 degree angle from a two-dimensional face of the three-dimensional model. The normal vector may have an x, y, and z value to signify its relative direction along each axis. The geometry of the three-dimensional model, along with the orientation of its polygon faces, may be detettnined using a photogrammetry algorithm with locked parameters as described above.

At step 704, a vector corresponding to a camera direction is determined for each image. In an embodiment, each vector may represent an orientation of a camera that took the corresponding image. The orientation may be determined using a photogrammetry algorithm with locked parameters as described above. Each camera vector determined in step 704 may have an x, y, and z value to signify its relative direction along each axis.

With the polygon and camera vectors determined, they may be compared to determine which image, if any, corresponds to each polygon of the three-dimensional model. Each polygon is evaluated as illustrated at decision block 706. Decision block 706 repeats steps 708-716 for each polygon face.

At step 708, a dot product is computed between the polygon vector and a view vector. In an embodiment, the view vector used to compute the dot product at step 708 may be the vector that corresponds to an image used to constrain the three-dimensional model. In other words, a user may have input a constraint that maps a position on the polygon face of the three-dimensional model to a position on the image corresponding to the view vector. If multiple images are used to constrain the model, then the dot product for each view vector may be computed. In that embodiment, dot products for the view vectors of each of the constrained images may be computed. The image selected for texture mapping the polygon may be the image corresponding to the greatest dot product. In alternative embodiments, the view vector used to compute the dot product at step 708 may correspond to a camera that is nearest to the polygon face or may correspond to an image having the highest resolution.

In an embodiment, if the dot product of the polygon and view vectors is positive, the camera faces the polygon, and the image taken from the camera may be used to texture the polygon. However, if the camera has a very steep view of the polygon face of the three-dimensional model, the image may appear pixelated when texture mapped to the polygon face. For this reason, in an additional embodiment, the image may only be used to texture the polygon if the dot product of the polygon and view vectors exceeds a positive threshold (e.g., 0.2) at decision block 710.

If the dot product of the polygon and view vectors exceeds the threshold, the photographic image that corresponds to the view vector is texture mapped to the polygon face at step 710. A person of skill in the art would recognize methods for texture mapping the image to the face. In an embodiment, the image may be back casted to the polygon.

If the dot product of the polygon and view vectors does not exceed the threshold, the photographic image that corresponds to the view vector may not be texture mapped be mapped to the polygon face. Instead, additional back-up images may be identified at step 714. The additional back-up images may be identified by comparing the view vector of each image with a polygon vector of the image. For example, a dot product between the vectors may be determined. If the dot product exceeds a threshold (e.g., 0.2), the image may potentially be texture mapped to the polygon and may be identified as a back-up image.

At step 716, a message is presented to a user. The message may indicate that no image may be texture mapped to the polygon face. The message may also list the back up images identified in step 714. The message may invite the user to add constraints to the back-up images. By adding a user constraint that maps a position on the three-dimensional model to at least one position of the back-up images, the user may ensure that the three-dimensional model and camera parameters associated with the image are properly aligned prior to texture mapping.

In this way, embodiments may provide an intuitive interface to constrain a three-dimensional model to allow it to be texture mapped. An example interface is illustrated below with respect to FIG. 8.

In an embodiment, the algorithm to select textures for a three-dimensional model may operate according to the following pseudo-code. The pseudo-code may include two high-level steps: (1) finding all the untextured faces; and (2) finding all the backup images that could be used to texture those untextured faces. The pseudo-code utilizes the following definitions:

CI: The set of the constrained images.
UI: The set of the unconstrained images (e.g., backup images).
AF: The set of all geometry faces.
TF: The set of geometry faces that can be textured with images in CI.
UF: The set of geometry faces that cannot be textured with images in CI.
RI: The subset of images in UI that could be constrained in order to texture the faces in UF. These are the images that we should invite the user to add constrains to.

Step one of the pseudo-code is:
Make TF empty
For each face in AF
   For each image in CI
     Compute Dot Product of View Vector and Polygon Vector
     If Dot Product Value >0.2
       Add the face to TF
     End If
   End For
End For $$UF = AF - TF$$

Step two of the pseudo-code is:
Make RI empty
For each face in UF
   For each image in UI
     Compute Dot Product of View Vector and Polygon Vector
     If Dot Product Value >0.2
       Add image to RI
     End If
   End For
End For After steps one and two, a message is shown to invite the user to add constraints to those images in RI. An example message is illustrated in FIG. 8.

Figure 8:
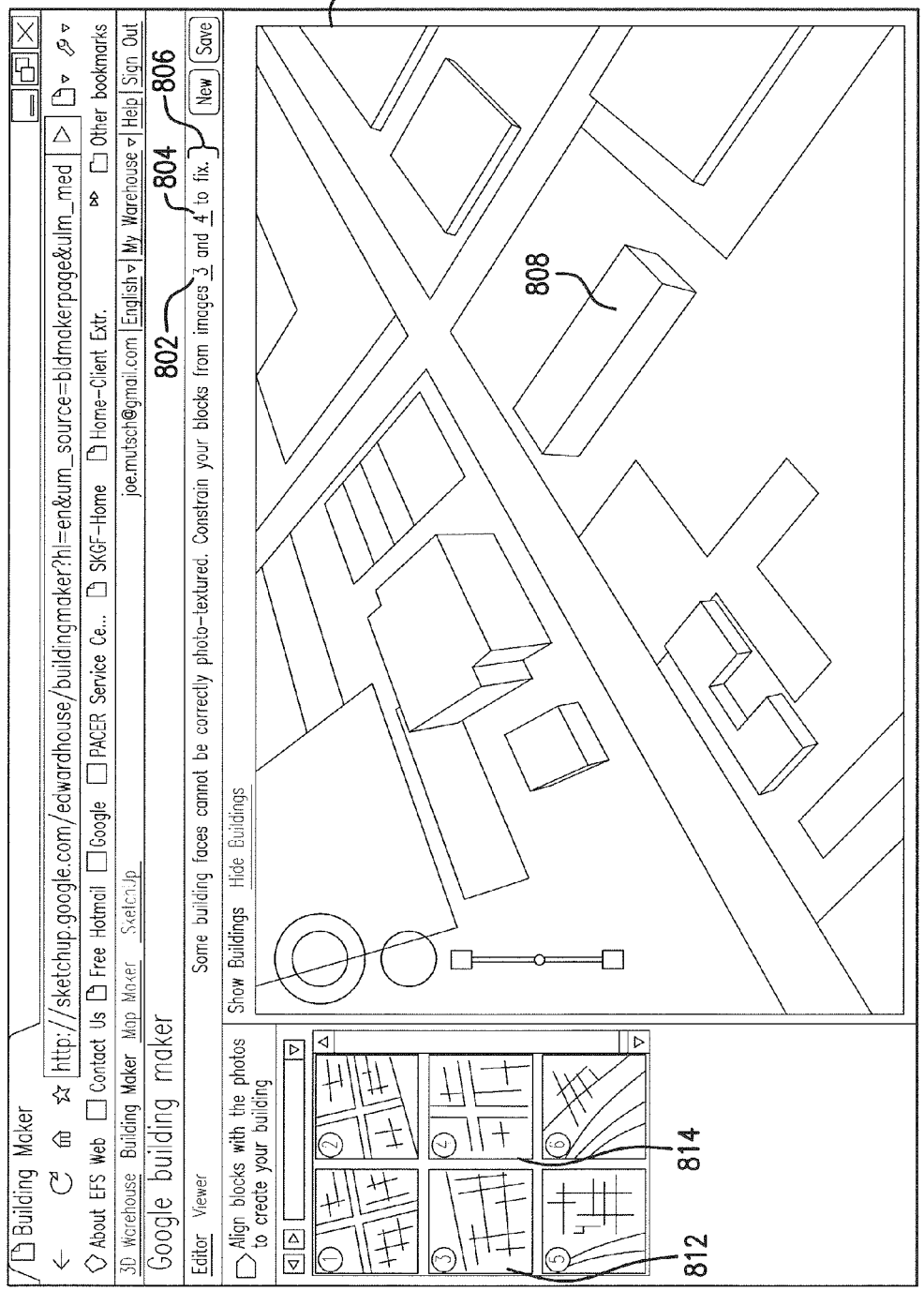
FIG. 8 is a diagram illustrating a user interface enabling a user to correct a three-dimensional model to enable texture mapping.

FIG. 8 is a diagram illustrating a user interface 800 enabling a user to correct a three-dimensional model to enable texture mapping. User interface 800 shows a viewport 810 displaying a three-dimensional model 808.

At least one of the faces of three-dimensional model 808 may not be photo-textured. In other words, of the images that have been constrained the face of the three-dimensional model 808, none are properly oriented capture the face. However, other images may exist that are oriented capture the face. But, those images do not have associated user constraints that map them to the face. In user interface 800, the interface notifies the user of this error in texturing with a message 806.

Message 806 identifies additional back up images that are oriented toward the untextured face, but are not yet constrained to the face. Message 806 identifies the back up images with links 802 and 804. Each of links 802 and 804 correspond to a back up image, such as images 812 and 814.

When a user selects one of links 802 and 804, a corresponding backup image may appear in viewport 810. With the backup image in viewport 810 a user may enter a constraint mapping a point on the back up image with a point on the three-dimensional model, thereby enabling the backup image to be accurately texture mapped to the face of the three-dimensional model.

In this way, embodiments provide an intuitive interface for both creating a three-dimensional model from images and enabling those images to be texture mapped to the model. As illustrated in user interface 800, disclosed embodiments may be useful for creating three-dimensional models of building exteriors. Further, aspects may be useful for creating three-dimensional models of building interiors as described below with respect to FIGS. 9-11.

Interior Modeling Using a Floor Plan

Figure 9:
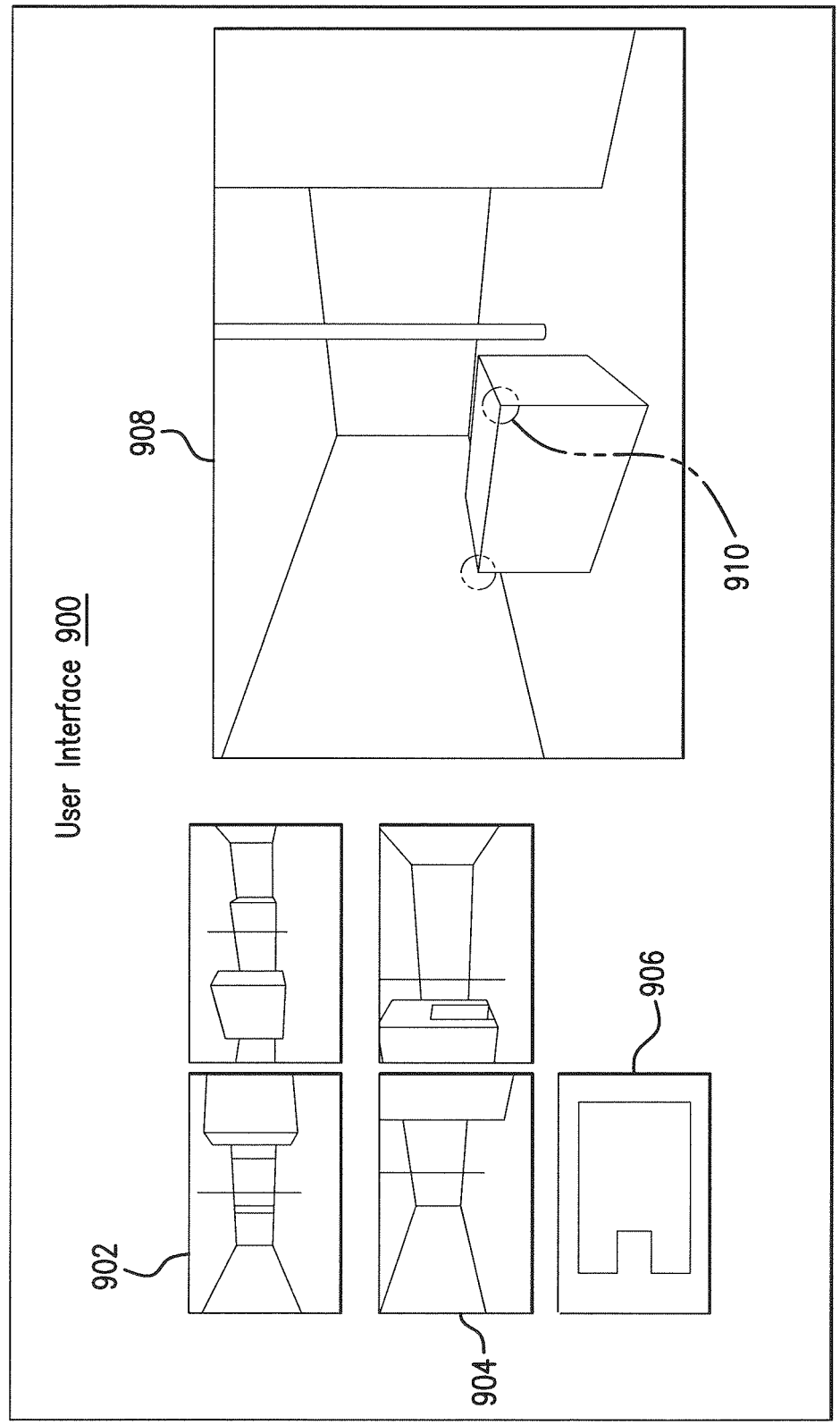
FIG. 9 is a diagram illustrating a user interface creating a three-dimensional model of a building interior from two-dimensional images of the interior.

FIG. 9 is a diagram illustrating a user interface 900 creating a three-dimensional model of a building interior from two-dimensional images of the interior. In examples, user interface 900 may enabling modeling of interior walls, ceilings, and furniture.

User interface 900 includes a viewport 908, a floor plan 906 and photographic images, such as images 902 and 904. The photographic images may be images taken by a user. A separate interface (not shown) may be provided to enable a user to specify floor plan 906. Alternatively, a user may upload an image (when may not be photographic) representing floor plan 906. Similar to user interface 100 in FIG. 1, when a user selects the floor plan or one of the images, the floor plan or the image appears in viewport 908.

In viewport 908, a three-dimensional model 910 may be displayed with the photographic image or floor plan. As mentioned above with respect to FIG. 1, three-dimensional model 910 may be displayed as a wireframe structure so as to avoid obscuring the image or floor plan.

From viewport 908, a user may enter a constraint, such as a constraint 910, mapping a position on the three-dimensional model to a position on the floor plan or image displayed within viewport 908. By entering constraints on the images and floor plan, a three-dimensional model of the interior may be created as illustrated in FIG. 10.

Figure 10:
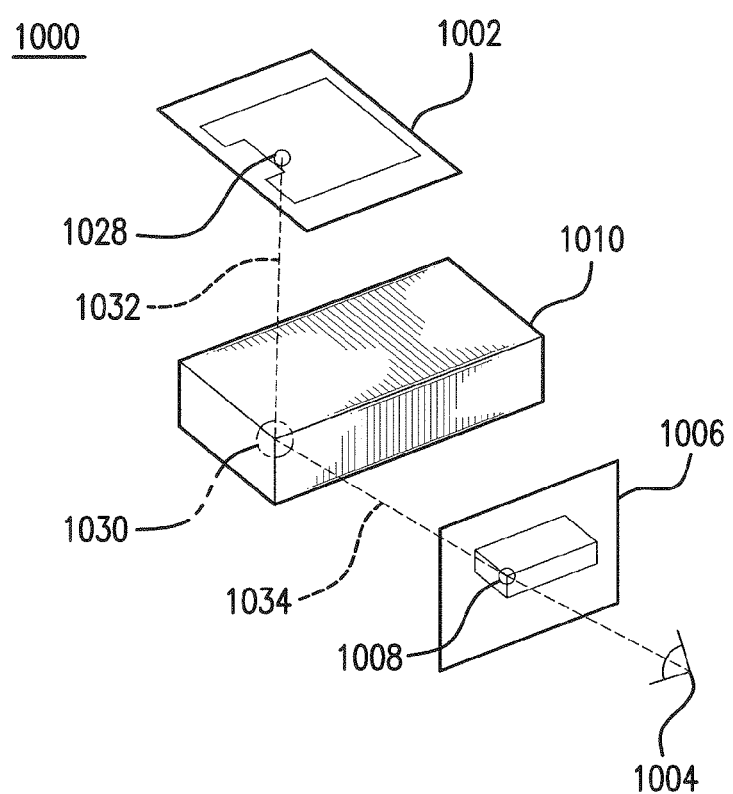
FIG. 10 is a diagram illustrating creating a three-dimensional model of a building interior from user selections on a floor plan of the interior.

FIG. 10 shows a diagram 1000 illustrating creating a three-dimensional model of a building interior from user selections on a floor plan of and a photographic image the interior.

Similar to diagram 200 in FIG. 2, diagram 1000 shows a photographic image 1006 and a floor plan 1002. Photographic image 1006 may capture a building interior from a horizontal perspective, as illustrated by a camera 1004. Floor plan 1002 shows a top-down view of the building interior. Floor plan 1002 may, for example, provide a top down view showing walls, rooms and spaces of the building interior. A user may input constraints on image 1006, such as constraint 1008. A user may input constraints on floor plan 1002, such as constraint 1004, and a user may input constraints on image 1006, such as constraint 1008. Those constraints may be used to determine the geometry of three-dimensional model 1010.

To determine the geometry of three-dimensional model 1010, the user constraints from the image and floor plan may be used to determine rays in three-dimensional space and the rays are used to determine the geometry. In diagram 1000, a ray 1032 may be determined based on user constraint 1028, and a ray 1034 may be determined based on a user constraint 1008. Because constraint 1032 corresponds to a floor plan with a top-down view, ray 1032 may extend straight down vertically. In contrast, ray 1034 may be constructed based on parameters associated with camera 1004. For example, ray 1034 may be extended from a focal point or entrance pupil of camera 1004 through a point corresponding to user constraint 1008 at a focal length distance of camera 1004. Using rays 1032 and 1034, a position 1030 on three-dimensional model 1010 may be determined using, for example, linear programming.

In this way, by allowing a user to constrain a floor plan, determining a three-dimensional model of an interior presents a linear programming problem similar linear programming problem to determine a three-dimensional model of an exterior above. Using a floor plan to determine a three-dimensional model of an interior is described in greater detail below with respect to FIG. 11.

Figure 11:
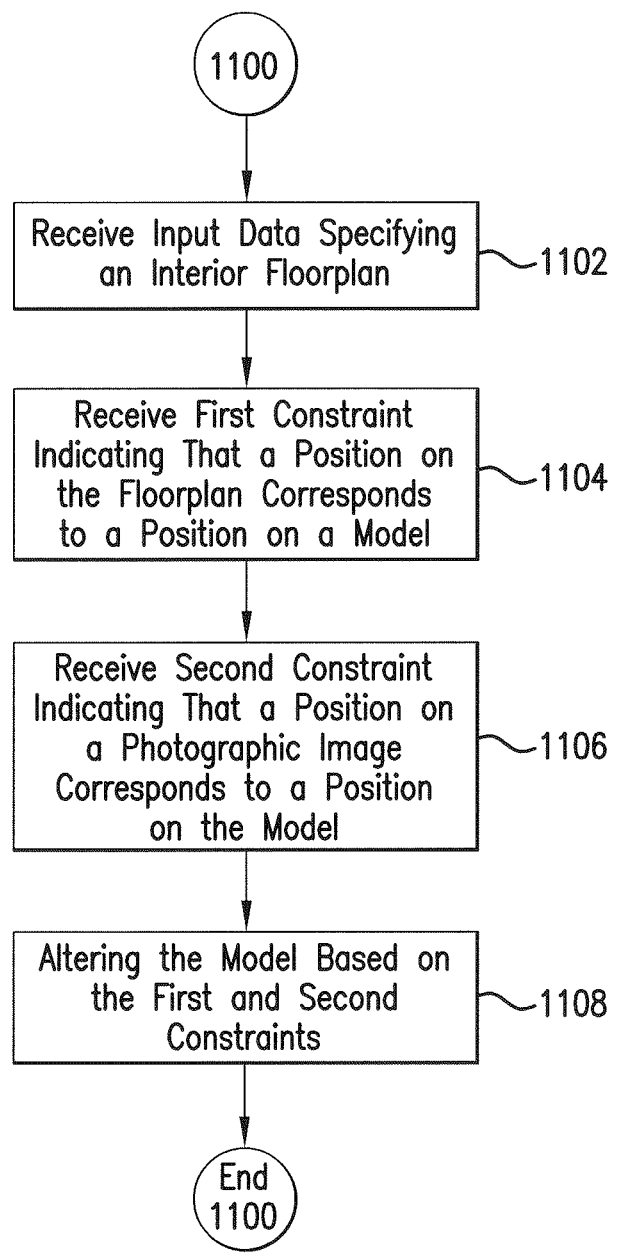
FIG. 11 is a flowchart showing a method for creating a three-dimensional model of a building interior from user selections on a floor plan of the interior.

FIG. 11 is a flowchart showing a method 1100 for creating a three-dimensional model of a building interior from user selections on a floor plan of the interior. Method 1100 begins at step 1102 by receiving input data from a user specifying a floor plan of the interior of the building. At step 1104, a first user constraint indicating that a position on the floor plan corresponds to a position on the three-dimensional model is received. At step 1106, a second user constraint indicating that a position on a photographic image of the interior corresponds to a position on the three-dimensional model is received.

Once the first and second constraints are received, the three-dimensional model and camera parameters representing a camera that took the photographic image of the interior may be altered. Geometric parameters and camera parameters may be solved using a linear programming algorithm. Certain parameters may be locked as described above with respect to FIGS. 3-5.

The three-dimensional model of the interior may be texture mapped using the photographic images. If a polygon face of the three-dimensional model is not adequately constrained to a photographic image directed to the face, then an interface may be provided to enable the user to correct the image as described with respect to FIGS. 6-7.

In this way, embodiments may create a three-dimensional model of an interior of a building using images of the interior and may texture map the images to the interior.

System

Figure 12:
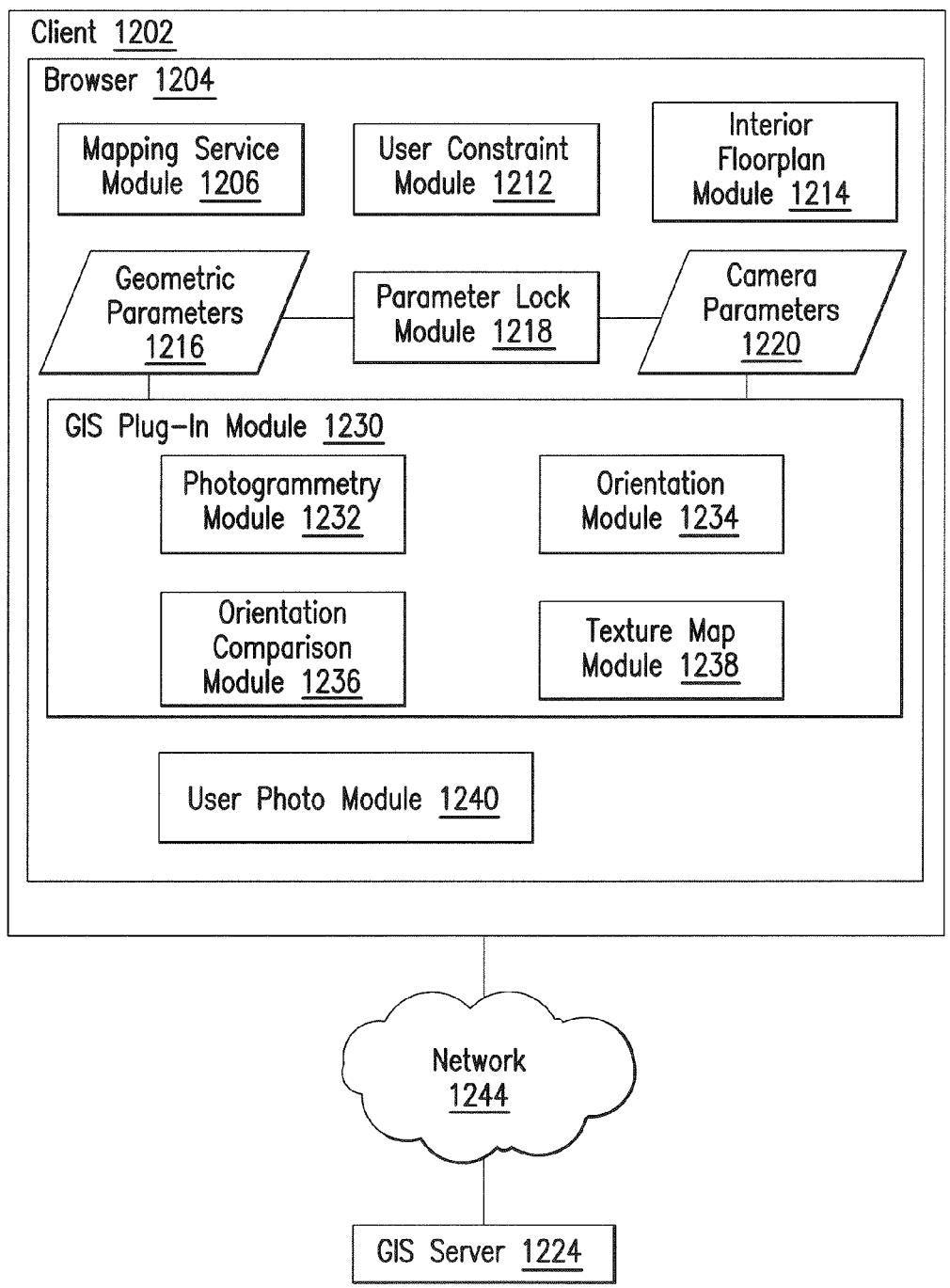
FIG. 12 is a diagram showing a system for creating a three-dimensional model from two-dimensional images.

FIG. 12 is a diagram showing a system 1200 for creating a three-dimensional model from two-dimensional images. System 1200 may operate as described above with respect to FIGS. 1-11. System 1200 includes a client 1202 coupled to a GIS server 1224 via one or more networks 1244, such as the Internet. Client 1202 includes a browser 1204. Browser 1204 includes a mapping service module 1206, a user constraint module 1212, an interior floor plan module 1214, a parameter lock module 1218, a GIS plug-in module 1230, a user photo module 1240, geometric parameters 1216 and camera parameters 1220. GIS plug-in module 1230 includes a photogrammetry module 1232, an orientation module 1234, an orientation comparison module 1236, a texture map module 1238. Each of these components is described below.

In embodiments, browser 1004 may be a CHROME, FIREFOX, SAFARI, or INTERNET EXPLORER browser. The components of browser 1204 may be downloaded from a server, such as a web server, and run with browser 1204. For example, the components of browser 1204 may be Hypertext Markup Language (HTML), JavaScript, or a plug-in, perhaps running native code. As mentioned above, mapping service 1206 is one such component. Mapping service 1206 displays a visual representation of a map, for example, as a viewport into a grid of map tiles. Mapping system 1206 is implemented using a combination of markup and scripting elements, for example, using HTML and JavaScript. A user may select the map to indicate where she would like to create a three-dimensional model.

Upon receipt of a user selection indicating a particular region at which to create a three-dimensional model, user constraint module 1212 may display an interface as illustrated in examples in FIGS. 1, 8, and 9. As illustrated in those figures, the interface may display photographic images of the area. User constraint module 1212 may retrieve the images from GIS server 1224.

GIS server 1224 may include a web server. A web server is a software component that responds to a hypertext transfer protocol (HTTP) request with an HTTP reply. The web server may serve content such as hypertext markup language (HTML), extendable markup language (XML), documents, videos, images, multimedia features, or any combination thereof. This example is strictly illustrative and does not limit the present invention.

User constraint module 1212 may receive at least one constraint, input by a user, for a two-dimensional photographic images from the set of two-dimensional photographic images received from GIS server 1224. Each constraint indicates that a position on the two-dimensional photographic image corresponds to a position on the three-dimensional model.

Parameter lock module 1218 locks camera parameters 1220 that represent cameras that took the photographic images received from GIS server 1224 and geometric parameters 1216 that specify a three-dimensional model. When the number of constraints by the user constraint input module for the two-dimensional photographic image is less than or equal to a first threshold value, parameter lock module 1218 may lock camera parameters 1220.

In an embodiment, parameter lock module 1218 locks the camera parameters when the number of constraints received is greater than the second threshold value. The second threshold value may be greater than the first threshold value. In examples, the first threshold value may be 4 and the second threshold value may be 15.

In a further embodiment, parameter lock module 1218 may lock camera parameters 1220 for each photographic image in the set of photographic images, except a two-dimensional photographic image for which a user constraint is received by user constraint module 1212.

Once parameter lock module 1218 locks the appropriate parameters, photogrammetry module 1232 may modify geometric parameters 1216 and camera parameters 1220 according to the user constraints received by user constraint module 1212. Photogrammetry module 1232 may determine new values for any unlocked parameters 1216 and 1220. Locking the camera or geometric parameters enables efficient execution of the photogrammetry algorithm. Parameter lock module 1218 may operate as described above with respect to FIGS. 4A-B.

In this way, parameter lock module 1218 helps to determine geometric parameters 1216 representing a three-dimensional model and camera parameters 1220 representing cameras. Geometric parameters 1216 and camera parameters 1220 may be used to texture map the photographic images received from GIS server 1224 to the three-dimensional model.

System 1200 further includes a user photo module 1240 that enables a user to input a user photo to use in modeling and texturing. In an embodiment, when the number of constraints received by the user constraint module exceeds a threshold value (e.g. 7), user photo module enables a user to input a user photographic image.

To texture map the photographic images, orientation module 1234 determines a polygon orientation of a polygon defining a face of the three-dimensional model specified in geometric parameters 1216. Orientation module 1234 may also determines a plurality of camera orientations as specified in camera parameters 1220.

In an embodiment, orientation module 1234 determines a polygon vector normal to the polygon defining the face of the three-dimensional model. Further, for each camera that took each photographic image in the set of photographic images, orientation module 1234 determines a view vector representing orientation of the camera when the camera took the photographic image Orientation comparison module 1236 determines whether any photographic image is directed toward the polygon face. In other words, orientation comparison module 1236 compares the polygon orientation with each of the plurality of camera orientations to determine which photographic image, if any, can be textured to the face of the polygon without blurring. In an embodiment, orientation comparison module 1236 determines a result of a dot product of the polygon vector and each view vector determined by orientation module 1234. If the result of the dot product exceeds a threshold, the photographic image is sufficiently directed toward the polygon face to use the image for texture mapping.

Despite being directed towards a polygon face, an image may still be unsuitable for texture mapping if a user has not constrained the image to the three-dimensional model. If no constraint is inputted mapping a position on the image to a position on the three-dimensional model, the orientation comparison module 1236 may identify the image as a back up image that may be used in texture mapping but for the lack of a constraint for the image.

If orientation comparison module 1236 identifies a constrained image directed toward a polygon face, texture map module 1238 texture maps the image to the polygon. Texture map module 1238 may use back casting to texture map the polygon face.

If orientation comparison module 1236 does not identify a constrained image directed toward a polygon face, texture map module 1238 may leave the face untextured and render the face in a solid color (e.g., black). Further, texture map module 1238 may provide an option to a user to add an additional constraint mapping a position on a back-up photographic image to a position on the three-dimensional model.

In addition to creating and texture mapping three-dimensional models of building exteriors, system 1200 may create and texture mapping three-dimensional models of building interiors.

System 1200 includes an interior floor plan module 1214 that receives input data from a user specifying a floor plan of the interior of the building. Interior floor plan module 1214 provides an interface that enables the user to specify a geometry of the floor plan.

To model interiors, user constraint module 1212 may accept constraints that may a position on the floor plan to a position on the three-dimensional model. Moreover, photogrammetry module may solve geometric and camera parameters in view of those constraints.

Each of client 1202 and GIS server 1224 may be implemented on any computing device. Such computing device can include, but is not limited to, a personal computer, mobile device such as a mobile phone, workstation, embedded system, game console, television, set-top box, or any other computing device. Further, a computing device can include, but is not limited to, a device having a processor and memory for executing and storing instructions. Software may include one or more applications and an operating system. Hardware can include, but is not limited to, a processor, memory and graphical user interface display. The computing device may also have multiple processors and multiple shared or separate memory components. For example, the computing device may be a clustered computing environment or server farm.

Each of browser 1204, mapping service module 1206, user constraint module 1212, interior floor plan module 1214, parameter lock module 1218, GIS plug-in module 1230, photogrammetry module 1232, orientation module 1234, orientation comparison module 1236, texture map module 1238 and user photo module 1240 may be implemented in hardware, software, firmware, or any combination thereof.

Each of geometric parameters 1232 and camera parameters 1220 may be stored in any type of structured memory, including a persistent memory. In examples, each database may be implemented as a relational database.

The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A computer-implemented method comprising:
   displaying, by one or more computing devices, as three-dimensional model of an interior of a building;
   receiving, by the one or more computing devices, input data from a user specifying a floor plan of the interior of the building;
   receiving, by the one or more computing devices, a first constraint input by a user indicating that a position on the floor plan corresponds to a position on the displayed three-dimensional model;
   receiving, by the one or more computing devices, a second constraint input by a user indicating that a position on a photographic image of the interior corresponds to a position on the displayed three-dimensional model wherein a camera took the photographic image of the interior;
   locking, by the one or more computing devices, a first geometric parameter associated with the three-dimensional model based at least in part on the first constraint input by the user or a first camera parameter associated with the camera as a locked parameter based at least in part on the second constraint input by the user; and altering, by the one or more computing devices, as second geometric parameter associated with the three-dimensional model or a second camera parameter associated with the camera based on the first and second constraints and the locked parameter.

2. The method of claim 1, further comprising:
providing an interface that emibles the user to specify a geometry of the floor plan.

3. The method of claim 1, wherein the photographic image is provided by the user, further comprising:
receiving the photographic image as an input from the user.

4. The method of claim 1, wherein the three dimensional model comprises information modeling interior walls, ceilings, and furniture.

5. The method of claim 1, further comprising:
texture mapping the photographic image to the three dimensional model.

6. The method of claim 1, wherein the altering comprises applying a linear programming algorithm to determine the second geometric parameter.

7. The method of claim 6, wherein the altering comprises applying the linear programming algorithm to determine the second camera parameter.

8. The method of claim 1, wherein the first constraint is input by selecting respective points on the floor plan and the displayed three-dimensional model, and wherein the second constraint is input by selecting respective points on the photographic image and the displayed three-dimensional model.

9. The method of claim 1, wherein receiving input data from a user specifying the floor plan comprises receiving input data showing a top-down view of the interior of the building.

10. The method of claim 1, wherein the value of the locked parameter is determined based upon a relative accuracy of parameters of the three-dimensional model or the camera.

11. A system comprising:
at least one processor;
an interior floor plan module configured to be executed on the at least one processor and that receives input data from a user specifying a floor plan of the interior of the building;
a user constraint input module configured to be executed on the at least one processor and that displays a three-dimensional model of an interior of a building, receives a first constraint input by a user indicating that a position on the floor plan corresponds to a position on the displayed three-dimensional model, and receives a second constraint input by a user indicating that a position on a photographic image of the interior corresponds to a position on the displayed three-dimensional model, wherein a camera took the photographic image of the interior; and
a photogrammetry module configured to be executed on the at least one processor and that locks a first geometric parameter associated with the three-dimensional model based at least in part on the first constraint input by the user or a first camera parameter associated with the camera as a locked parameter based at least in part on the second constraint input by the user and alters a second geometric camera parameter associated with the three-dimensional model or a second camera parameter associated with the camera based on the first and second constraints and the locked parameter.

12. The system of claim 11, wherein the interior floor plan module provides an interface that enables the user to specify a geometry of the floor plan.

13. The system of claim 11, wherein the photographic image is provided by the user.

14. The system of claim 11, wherein the three dimensional model comprises interior walls, ceilings, and furniture.

15. The system of claim 11, further comprising:
a texture map module that texture maps the photographic image to the three dimensional model.

16. The system of claim 11, wherein the photogrammetry module applies a linear programming algorithm to determine the second geometric parameter.

17. The system of claim 16, wherein the photogrammetry module applies the linear programming algorithm to determine the second camera parameter.

18. The system of claim 11, wherein the photogrammetry module determines a value for the locked parameter based upon a relative accuracy of parameters of the three-dimensional model or the camera.

19. A computer program product comprising a non-transitory computer readable medium having control logic stored therein for causing a computer to perform a method comprising:
displaying a three-dimensional model of an interior of a building;
receiving input data from a user specifying a floor plan of the interior of the building;
receiving a first constraint input by a user indicating that a position on the floor plan corresponds to a position on the displayed three-dimensional model;
receiving a second constraint input by a user indicating that a position on a photographic image of the interior corresponds to a position on the displayed three-dimensional model, wherein a camera took the photographic. Image of the interior;
locking a first geometric parameter associated with the three-dimensional model based at least in part on the first constraint input by the user or a first camera parameter associated with the camera as a locked parameter based a least in part on the second constraint input by the user and
altering a second geometric parameter associated with the three-dimensional model or a second camera parameter associated with the camera based on the first and second constraints and the locked parameter.

20. The computer program product of claim 19, wherein the method further comprising:
providing an interface that enables the user to specify a geometry of the floor plan.

21. The computer program product of claim 19, wherein the photographic image is provided by the user, wherein the method further comprising:
receiving the photographic image as an input from the user.

22. The computer program product of claim 19, wherein the three dimensional model comprises information modeling interior walls, ceilings, and furniture.

23. The computer program product of claim 19, wherein the method further comprising:
texture mapping the photographic image to the three dimensional model.

24. The computer program product of claim 19, wherein the fourth computer readable program code comprises computer readable program code for applying a linear programming algorithm to determine the second geometric parameter.

25. The computer program product of claim 24, wherein the fourth computer readable program code further comprises computer readable program code for applying the linear programming algorithm to determine the second camera parameter.

26. The computer program product of claim 19, wherein the value of the locked parameter is determined based upon a relative accuracy of parameters of the three-dimensional model or the camera.

* * * * *